(12) United States Patent
Kim et al.

(10) Patent No.: US 6,327,190 B1
(45) Date of Patent: Dec. 4, 2001

(54) COMPLEMENTARY DIFFERENTIAL INPUT BUFFER FOR A SEMICONDUCTOR MEMORY DEVICE

(75) Inventors: Kyu-hyoun Kim; Soo-bong Chang, both of Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/521,904

(22) Filed: Mar. 9, 2000

(30) Foreign Application Priority Data

Mar. 29, 1999 (KR) ................................................ 99-10795

(51) Int. Cl.⁷ ........................................................ G11C 7/00
(52) U.S. Cl. ................................ 365/189.05; 365/230.08; 326/80; 326/83
(58) Field of Search .............................. 365/207, 189.05, 365/230.08; 326/80, 82, 83, 86

(56) References Cited

U.S. PATENT DOCUMENTS

| | | | |
|---|---|---|---|
| 5,670,910 | * | 9/1997 | Kato .................................... 330/253 |
| 5,723,986 | * | 3/1998 | Nakashiro et al. .................... 326/81 |
| 5,793,680 | * | 8/1998 | Okajima .......................... 365/189.05 |
| 5,903,508 | * | 5/1999 | Choi .................................... 365/229 |
| 5,963,053 | * | 10/1999 | Manohar et al. ...................... 326/60 |

OTHER PUBLICATIONS

Chappell, Terry, I., "A 2ns Cycle, 4ns Access 512kb CMOS ECL SRAM," IEEE International Solid–State Circuits Conference, ISSCC91 Technical Digest Session 3, 1999, pp. 50–51.

* cited by examiner

Primary Examiner—David Nelms
Assistant Examiner—Gene N. Auduong
(74) Attorney, Agent, or Firm—Mills & Onello LLP

(57) ABSTRACT

An input buffer of a semiconductor memory device includes a first differential amplifying portion including a first MOS transistor for receiving a first external input signal and a second MOS transistor for receiving a second external input signal. The voltage difference between the first and second external input signals is amplified and output as a first intermediate output voltage. A second differential amplifying portion includes a third MOS transistor for receiving the first external input signal and a fourth MOS transistor for receiving the second external input signal. The voltage difference between the first and second external input signals are amplified and output as a second intermediate output voltage. The first intermediate output of the first amplifying portion is combined with the second intermediate output of the second amplifying portion and the combined result is output as an output signal. The input buffer is less susceptible to fluctuations in ground and supply voltage levels due to noise, and the set-up time and hold time margins of the output signal are improved.

7 Claims, 2 Drawing Sheets

COMPLEMENTARY DIFFERENTIAL INPUT BUFFER FOR A SEMICONDUCTOR MEMORY DEVICE

BACKGROUND OF THE INVENTION

1. Field of the Invention

The present invention relates to a semiconductor memory device, and more particularly, to an input buffer for a semiconductor memory device.

2. Description of the Related Art

Semiconductor memory devices commonly include input buffers for converting the voltage level of a signal input from an external circuit to a voltage level suitable for an internal circuit. The input buffer operates to correctly detect the voltage level of the external signal to allow the semiconductor memory device to operate within normal parameters.

FIG. 1 is a circuit diagram of an N-type input buffer 101 of a conventional semiconductor memory device. Referring to FIG. 1, a conventional N-type semiconductor memory device 101 includes an NMOS transistor 111 for receiving external data IN, an NMOS transistor 112 for receiving a reference voltage Vref, a current mirror 131 constituted of PMOS transistors 121 and 122, a PMOS transistor 123 for providing a supply voltage Vdd to the current mirror 131 in response to an external control signal PBPUB, and an inverter 141 for inverting data from a node N1 and for outputting output data OUT of the N-type input buffer 101.

In the case where the external input data IN is logic high in the N-type input buffer 101, assuming that there is noise present in a ground voltage Vss, it takes longer for the data output from the node N1 to transition from logic high to logic low due to the noise. Therefore, the length of time, or "skew", for the data output from the node N1 to transition from logic high to logic low, i.e. "high-voltage skew", becomes larger. Accordingly, the set-up time and hold time margins of the data OUT output of the N-type input buffer 101 are reduced.

FIG. 2 is a circuit diagram of a P-type input buffer of a conventional semiconductor memory device. Referring to FIG. 2, a conventional P-type input buffer 201 includes a PMOS transistor 211 for receiving external data, a PMOS transistor 212 for receiving a reference voltage, a current mirror 231 constituted of NMOS transistors 221 and 222, a PMOS transistor 213 for providing a supply voltage Vdd to the PMOS transistors 211 and 212 in response to the external control signal PBPUB, and an inverter 241 for inverting data from a node N2 and for outputting the output data OUT of the P-type input buffer 201.

In the case where the external data IN is logic low in the P-type input buffer 201, assuming the presence of noise in the supply voltage Vdd, it takes longer for the data output from the node N2 to transition from logic low to logic high due to the noise. Therefore, the skew time for the data output from the node N2 to transition from logic low to logic high, i.e. "low-voltage skew", becomes larger. Accordingly, the set-up time and hold time margins of the data OUT output of the P-type input buffer 201 are reduced.

As mentioned above, according to the conventional technology, since the high-voltage skew or low-voltage skew of the data OUT output from the input buffers 101 and 201 is relatively larger, the set-up time and hold time margins of the data OUT are reduced. Furthermore, it is increasingly difficult to reduce the skew of the data OUT as the trend toward ever-lower supply voltages Vdd continues.

SUMMARY OF THE INVENTION

To address the above-mentioned limitations, it is an object of the present invention to provide an input buffer for a semiconductor memory device by which it is possible to reduce the skew of output data.

It is another object of the present invention to provide an input buffer for a semiconductor memory device by which it is possible to reduce the skew of output data in a configuration that is amenable to use with semiconductor circuits of ever-lowering supply voltages.

Accordingly, to achieve the above objects, there is provided an input buffer for a semiconductor memory device. The input buffer includes a first differential amplifying portion including a first MOS transistor for receiving a first external input signal and a second MOS transistor for receiving a second external input signal. The voltage difference between the first and second external input signals is amplified and output as a first intermediate output voltage. A second differential amplifying portion includes a third MOS transistor for receiving the first external input signal and a fourth MOS transistor for receiving the second external input signal. The voltage difference between the first and second external input signals are amplified and output as a second intermediate output voltage. The first intermediate output of the first amplifying portion is combined with the second intermediate output of the second amplifying portion and the combined result is output as an output signal.

In a preferred embodiment, the first and second MOS transistors comprise NMOS transistors and the third and fourth MOS transistors comprise PMOS transistors.

The first differential amplifying portion preferably further comprises a first current mirror activated by the output of the second MOS transistor, for providing a supply voltage to the first and second MOS transistors. The first current mirror is preferably comprised of a plurality of PMOS transistors.

The second differential amplifying portion preferably further comprises a second current mirror activated by the output of the fourth MOS transistor, for providing a ground voltage to the third and fourth MOS transistors. The second current mirror is preferably comprised of a plurality of NMOS transistors.

Either the first external signal or the second external signal may comprise a reference voltage.

The input buffer of the present invention is less susceptible to fluctuations in ground and supply voltage levels due to noise, and the set-up time and hold time margins of the output signal are improved.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
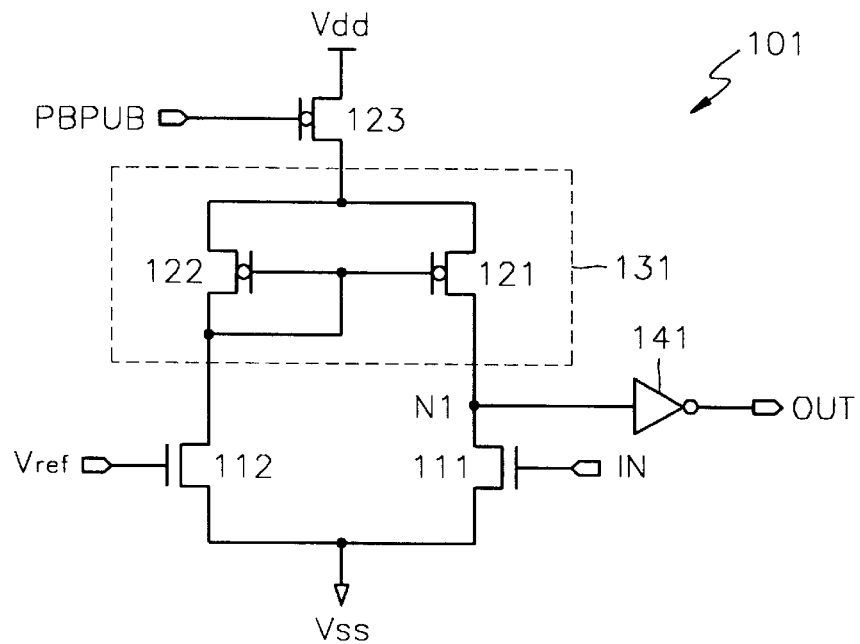
FIG. 1 is a circuit diagram of an N-type input buffer for a conventional semiconductor memory device.
Figure 2:
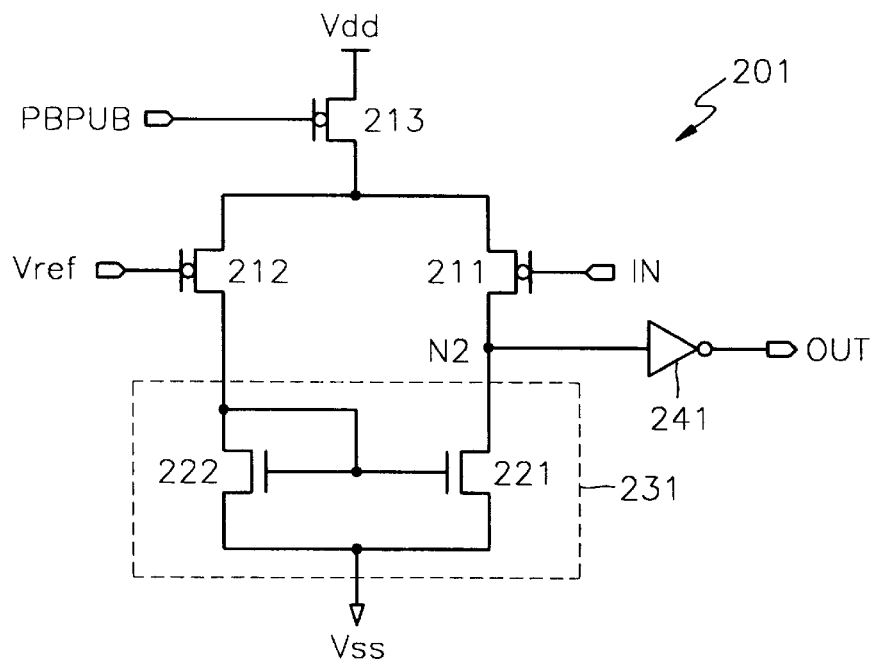
FIG. 2 is a circuit diagram of a P-type input buffer for a conventional semiconductor memory device.

An input buffer of a semiconductor memory device according to a preferred embodiment of the present invention will be described with reference to FIG. 3. An input buffer 301 includes a first differential amplifier 311 and a second differential amplifier 312. The first and second differential amplifiers 311 and 312 each receive first and second external input signals Vin1 and Vin2 and generate intermediate output signals Vout1 and Vout2, respectively. The output signal Vout of the input buffer 301 is obtained by combining, or summing, the output signals Vout1 and Vout2.

The first differential amplifier 311 includes a first current mirror 341 and first and second NMOS transistors 321 and 322. The first NMOS transistor 321 is activated or deactivated (turned on or off) by the first external signal Vin1. Namely, for example when the first external signal Vin1 is logic high, the first NMOS transistor 321 is turned on and lowers the voltage of node N3 to the level of the ground voltage Vss. When the first external signal Vin1 is logic low, the first NMOS transistor 321 is turned off. The second NMOS transistor 322 is turned on or off by the second external signal Vin2. When the voltage level of the second external signal Vin2, which is input to the second NMOS transistor 322, is higher than that of the first external signal Vin1, the second NMOS transistor 322 conducts more current than the first NMOS transistor 321. Accordingly, the voltage of node N4 is lowered to the ground voltage level. When the voltage level of the second external signal Vin2 is lower than that of the first external signal Vin1, the second NMOS transistor 322 is turned off. Accordingly, the voltage of node N4 is placed in a floating state.

The first current mirror 341 includes PMOS transistors 333 and 334 and is connected to the first and second NMOS transistors 321 and 322 as shown. The first current mirror 341 is turned on or off by the voltage level of node N4. Namely, when the second NMOS transistor 322 is turned on and the voltage of node N4 is lowered to the level of the ground voltage Vss, the PMOS transistors 333 and 334 are turned on and apply the supply voltage Vdd to the node N3. When the second NMOS transistor 322 is turned off, the node N4 is floated and therefore is in a state of high impedance. Accordingly, the PMOS transistors 333 and 334 are turned off, and thus the supply voltage Vdd is not applied to node N3.

The operation of the first differential amplifier 311 will now be described. When the voltage of the first external input signal Vin1 is higher than that of the second external input signal Vin2, the first NMOS transistor 321 conducts more current than the second NMOS transistor 322. Accordingly, the voltage of node N3 is lowered to the level of the ground voltage Vss. However, since the voltage of node N4 is much higher than the ground voltage Vss, the PMOS transistors 333 and 334 are turned off. Therefore, the output signal Vout1 becomes logic low. When the voltage of the second external signal Vin2 is higher than that of the first external signal Vin1, the second NMOS transistor 322 conducts more current than the first NMOS transistor 321. Accordingly, the voltage of node N4 is lowered to the level of the ground voltage Vss and the voltage of node N3 is much higher than that of the ground voltage Vss. Therefore, the PMOS transistors 333 and 334 are turned on. Accordingly, since the voltage of the node N3 is increased to the level of the supply voltage Vdd, the output signal Vout1 becomes logic high.

The response of the first differential amplifier 311 is greatly affected by noise present in the ground voltage Vss. However, it is only slightly affected by noise present in the supply voltage Vdd.

The second differential amplifier 312 includes a second current mirror 342 and first and second PMOS transistors 331 and 332. The first PMOS transistor 331 is turned on or off by the first external signal Vin1. Namely, when the first external signal Vin1 is logic low, the first PMOS transistor 331 is turned on, thus increasing the voltage of node N5 to the level of the supply voltage Vdd. When the first external signal Vin1 is logic high, the first PMOS transistor 331 is turned off. The second PMOS transistor 332 is turned on or off by the second external signal Vin2. Namely, when the second external signal Vin2 is logic low, the second PMOS transistor 332 is turned on, thus increasing the voltage level of node N6 to the level of the supply voltage Vdd. When the second external signal Vin2 is logic high, the second PMOS transistor is turned off.

The second current mirror 342 includes NMOS transistors 323 and 324 and is connected to the first and second PMOS transistors 331 and 332. The second current mirror 342 is turned on or off by the voltage level of node N6. Namely, when the second PMOS transistor 332 is turned on and the voltage level of node N6 is increased to the level of the supply voltage Vdd, the NMOS transistors 323 and 324 are turned on, thus lowering the voltage of node N5 to the level of the ground voltage Vss. When the second PMOS transistor 332 is turned off, the node N6 is floated and is in the state of high impedance. Accordingly, the NMOS transistors 323 and 324 are turned off, and thus the ground voltage level Vss is not applied to node N5.

The operation of the second differential amplifier 312 will now be described. When the voltage of the first external signal Vin1 is higher than that of the second external signal Vin2, the second PMOS transistor 332 conducts more current than the first PMOS transistor 331. Thus, the voltage of node N6 is lowered to the level of the ground voltage Vss. Accordingly, the intermediate output signal Vout2 becomes logic low. When the voltage of the second external signal Vin2 is higher than that of the first external signal Vin1, the first PMOS transistor 331 conducts more current than the second PMOS transistor 332. Thus, since node N6 is floated and is in the state of high impedance, the NMOS transistors 323 and 324 are turned off. Since the supply voltage Vdd is applied to node N5 in this state, the voltage of the node N5 is increased to the level of the supply voltage Vdd. Accordingly, the intermediate output signal Vout2 becomes logic high.

The response of the second differential amplifier 312 is greatly affected by noise present in the supply voltage Vdd, however, it is only slightly affected by noise present in the ground voltage Vss.

The overall operation of the input buffer 301 will now be described with reference to FIG. 3. When the voltage of the first external input signal Vin1 is higher than that of the second external input signal Vin2, the first NMOS transistor 321 and the second PMOS transistor 332 are turned on. Then, since the voltage of node N3 is lowered to the level of the ground voltage Vss, the intermediate output signal Vout1 becomes logic low and the voltage of node N6 is increased to the level of the supply voltage Vdd. When the voltage of node N6 is increased to the level of the supply voltage Vdd, the NMOS transistors 323 and 324 are turned on. Therefore, the voltage of node N5 is lowered to the level of the ground voltage Vss. Accordingly, the intermediate output signal Vout2 becomes logic low. Therefore, the generated output signal Vout is logic low, since both of the output signals Vout1 and Vout2 are logic low.

When the voltage of the second external input signal Vin2 is higher than that of the first external input signal Vin1, the second NMOS transistor 322 and the first PMOS transistor 331 are turned on. Then, since the voltage of node N5 is increased to the level of the supply voltage Vdd, the second intermediate output signal Vout2 becomes logic high and the voltage of node N4 is lowered to the level of the ground voltage Vss. When the voltage of node N4 is lowered to the level of the ground voltage Vss, the PMOS transistors 333 and 334 are turned on. Therefore, the voltage of node N3 is increased to the level of the supply voltage Vdd. Accordingly, the first intermediate output signal Vout1 becomes logic high. Therefore, the generated output signal Vout is logic high since both of the intermediate output signals Vout1 and Vout2 are logic high.

In alternative embodiments, either the first external input signal Vin1 or the second external input signal Vin2 can be replaced by the reference voltage.

When noise is present in the supply voltage Vdd, the voltages Vgs between the gates and sources of the first and second PMOS transistors 331 and 332 change in the second differential amplifier 312, and the drain currents of the first and second PMOS transistors 331 and 332 change. Since only the voltages Vds between the drains and sources of the second NMOS transistor 322 and the PMOS transistor 333 change, and the voltage Vgs between the gate and source of the first NMOS transistor 321 does not change in the first differential amplifier 311, the drain currents of the first and second PMOS transistors 331 and 332 of the second differential amplifier do not change. Therefore, the variation of the output signal Vout as a result of noise is reduced to half that compared to the case where only the second differential amplifier 312 is employed. Namely, the change in voltage level of the output signal Vout is slight although noise is present in the supply voltage Vdd.

When noise is present in the ground voltage Vss, in the first differential amplifier 311, since the gate-source voltages Vgs of the first and second NMOS transistors 321 and 322 change, the drain currents of the first and second NMOS transistors 321 and 322 change. In the second differential amplifier 312, since only the drain-source voltages Vds of the second PMOS transistor 332 and the NMOS transistor 323 change and the gate-source voltage of the first PMOS transistor 331 does not change, the drain currents of the first and second NMOS transistors 321 and 322 do not change. Therefore, the change of the output signal Vout is reduced to half that compared to the case where only the first differential amplifier 311 is used. Namely, the change of the output signal Vout is slight although the noise is generated in the ground voltage Vss.

Figure 3:
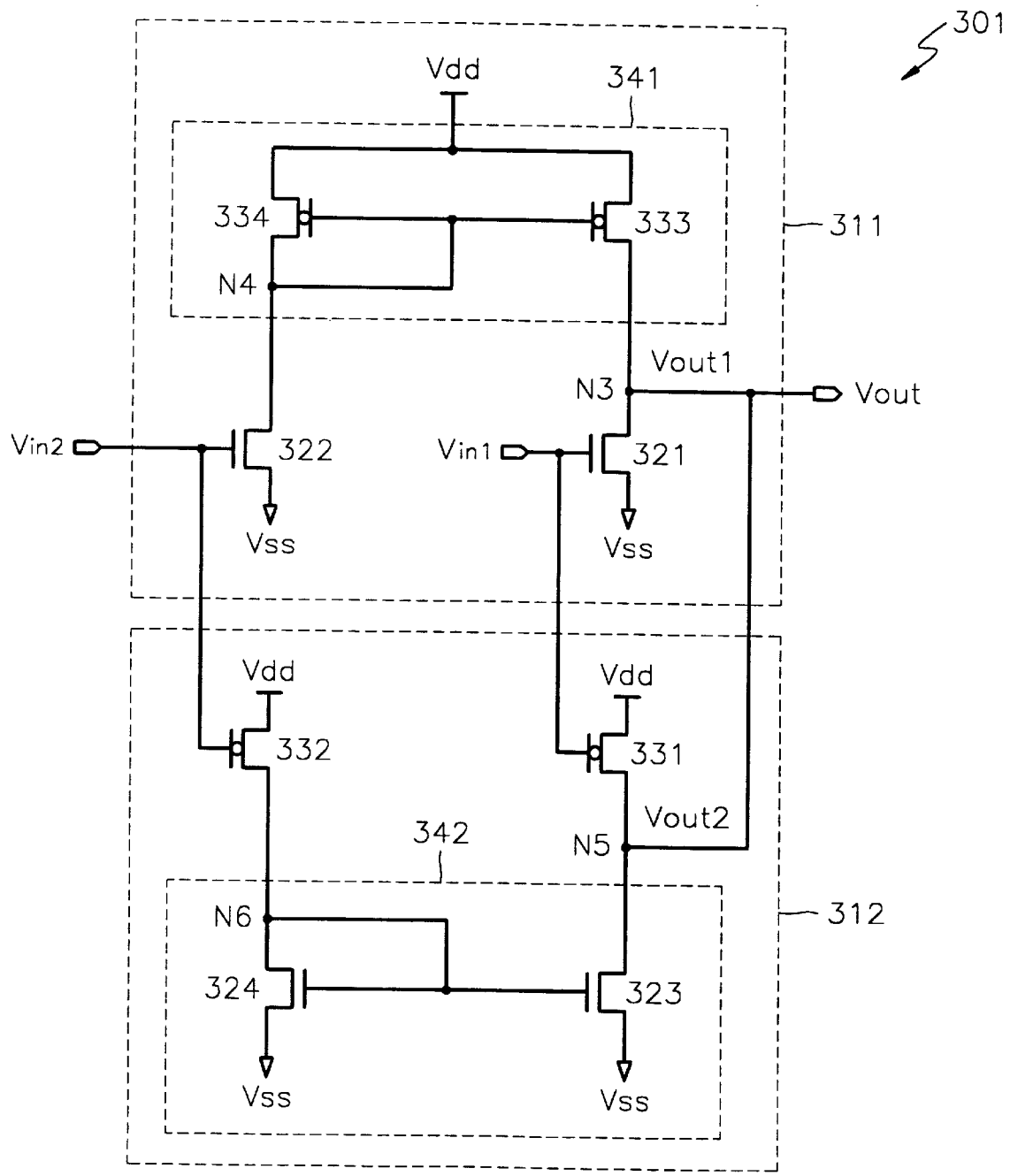
FIG. 3 is a circuit diagram of an input buffer of a semiconductor memory device according to a preferred embodiment of the present invention.

According to the input buffer 301 shown in FIG. 3, when noise is present in the ground voltage Vss, the high-voltage skew of the first differential amplifier 311 is reduced, which is compensated for by the second differential amplifier 312. When noise is generated in the supply voltage Vdd, the low-voltage skew of the second differential amplifier 312 is reduced, which is compensated for by the first differential amplifier 311. Therefore, since the high-voltage skew and the low-voltage skew of the output signal Vout output from the input buffer 301 are improved, the set-up time and hold time margins of the output signal Vout are improved. In particular, although the supply voltage Vdd applied to the input buffer 301 is low, the set-up time and hold time margins of the output signal Vout output from the input buffer 301 are to slightly affected and are improved.

As mentioned above, according to the present invention, since the high-voltage skew and the low-voltage skew of the output signal Vout are reduced significantly, although noise is generated in the supply voltage Vdd and the ground voltage Vss, the set-up time and hold time margins of the output signal Vout are improved. In particular, the high-voltage skew and the low-voltage skew of the output signal Vout are reduced significantly. These advantages are realized even as supply voltages are lowered according to current trends in semiconductor device technology.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. An input buffer for a semiconductor memory device, comprising:

a first differential amplifying portion including a first MOS transistor for receiving a first external input signal and a second MOS transistor for receiving a second external input signal, for amplifying the voltage difference between the first and second external input signals, and for outputting the amplified voltage difference as a first intermediate output, the first and second MOS transistors having electrodes coupled directly to a ground voltage; and a second differential amplifying portion including a third MOS transistor for receiving the first external input signal and a fourth MOS transistor for receiving the second external input signal, for amplifying the voltage difference between the first and second external input signals and for outputting the amplified voltage difference as a second intermediate output, the third and fourth MOS transistors having electrodes coupled directly to a supply voltage, wherein the first intermediate output of the first amplifying portion is coupled to the second intermediate output of the second amplifying portion at an output node.

2. The input buffer of claim 1, wherein the first and second MOS transistors comprise NMOS transistors and the third and fourth MOS transistors comprise PMOS transistors.

3. The input buffer of claim 2, wherein the first differential amplifying portion further comprises a first current mirror activated by the output of the second MOS transistor, for providing a supply voltage to the first and second MOS transistors.

4. The input buffer of claim 3, wherein the first current mirror is comprised of a plurality of PMOS transistors.

5. The input buffer of claim 1, wherein the second differential amplifying portion further comprises a second current mirror activated by the output of the fourth MOS transistor, for providing a ground voltage to the third and fourth MOS transistors.

6. The input buffer of claim 5, wherein the second current mirror is comprised of a plurality of NMOS transistors.

7. The input buffer of claim 1, wherein either the first external signal or the second external signal comprises a reference voltage.

* * * * *

UNITED STATES PATENT AND TRADEMARK OFFICE
CERTIFICATE OF CORRECTION

PATENT NO.   : 6,327,190 B1
DATED        : December 4, 2001
INVENTOR(S)  : Kyu-hyoun Kim It is certified that error appears in the above-identified patent and that said Letters Patent is hereby corrected as shown below:

<u>Title page,</u>
Item [*] Notice, insert -- This patent issued on a
continued prosecution application filed under 37 CFR 1.53(d), and is subject
to the twenty year patent term provisions of 35 U.S.C. 154(a)(2). --

Signed and Sealed this

Twelfth Day of August, 2003

JAMES E. ROGAN
*Director of the United States Patent and Trademark Office*